United States Patent [19]

Kawakami

[11] Patent Number: 5,729,469
[45] Date of Patent: Mar. 17, 1998

[54] WIRING METHOD AND SYSTEM FOR INTEGRATED CIRCUIT

[75] Inventor: Yoshiyuki Kawakami, Neyagawa, Japan

[73] Assignee: Matsushita Electric Industrial Co., Ltd., Osaka, Japan

[21] Appl. No.: 162,353

[22] Filed: Dec. 7, 1993

[30] Foreign Application Priority Data

Dec. 7, 1992 [JP] Japan .................................. 4-326602

[51] Int. Cl.⁶ .................................................. G06F 17/50
[52] U.S. Cl. ........................ 364/490; 364/489; 364/488
[58] Field of Search ........................... 364/488, 489, 364/490, 491

[56] References Cited

U.S. PATENT DOCUMENTS

| | | | |
|---|---|---|---|
| 4,615,011 | 9/1986 | Linsker | 364/491 |
| 4,754,408 | 6/1988 | Carpenter et al. | 364/491 |
| 5,155,692 | 10/1992 | Lweandowski | 364/489 |
| 5,309,371 | 5/1994 | Shikata et al. | 364/491 |
| 5,341,310 | 8/1994 | Gould et al. | 364/491 |
| 5,361,214 | 11/1994 | Aoki | 364/490 |
| 5,375,069 | 12/1994 | Satoh et al. | 364/490 |
| 5,583,788 | 12/1996 | Kuribayashi | 364/490 |

OTHER PUBLICATIONS

Dees, Jr., et al., "Automated Rip–up and Reroute Techniques", 19th Design Automation Conference, Paper 27.4, pp. 432–439, IEEE, 1982.

Heyns et al., "A Line–Expansion Algorithm for the General Routing Problem with a Guaranteed Solution", Proc. 17th Design Automation Conference, pp. 243–249, 1980.

Soukup, "Fast Maze Router", Proc. 15th Design Automation Conference, pp. 100–102, 1978.

Stange, "A Test Methodology for Large Logic Networks", IBM Corporation, p. 103.

*Primary Examiner*—Vincent N. Trans
*Attorney, Agent, or Firm*—McDermott, Will & Emery

[57] ABSTRACT

The present invention discloses an improved wiring method. Grids are defined at a grid-routing step in such a way that a part of predetermined design criteria are met. Wiring routes are decided on the basis of these grids so that they follow the design criteria and plural functional blocks are connected together. When some nets are left in such a manner that they are assigned no wiring routes, their wiring routes are decided at a non grid-routing step following the design criteria, in defiance of the grids but in accordance with the design criteria. If there are still some nets without wiring routes, their wiring routes are decided at a non grid-routing step ignoring the design criteria. Then, some of the already-defined wiring routes are shoved so as to meet each of the design criteria, and individual wiring patters are generated with respect to all of the decided wiring routes in such a manner that the criteria are met. Even if a greater amount of wiring must be carried out within a smaller area, generation of required wiring patterns can be completed in a short time.

17 Claims, 10 Drawing Sheets

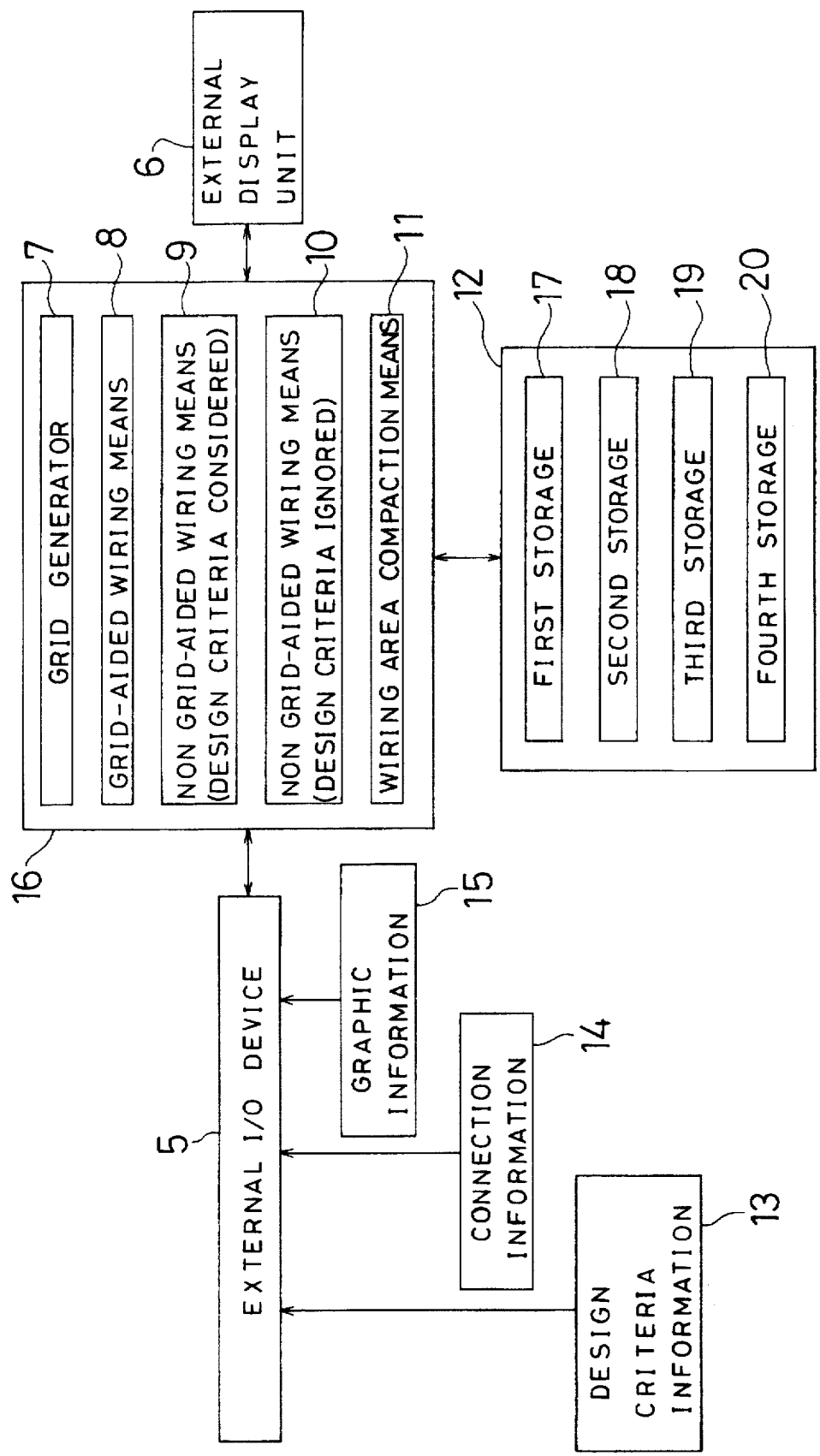

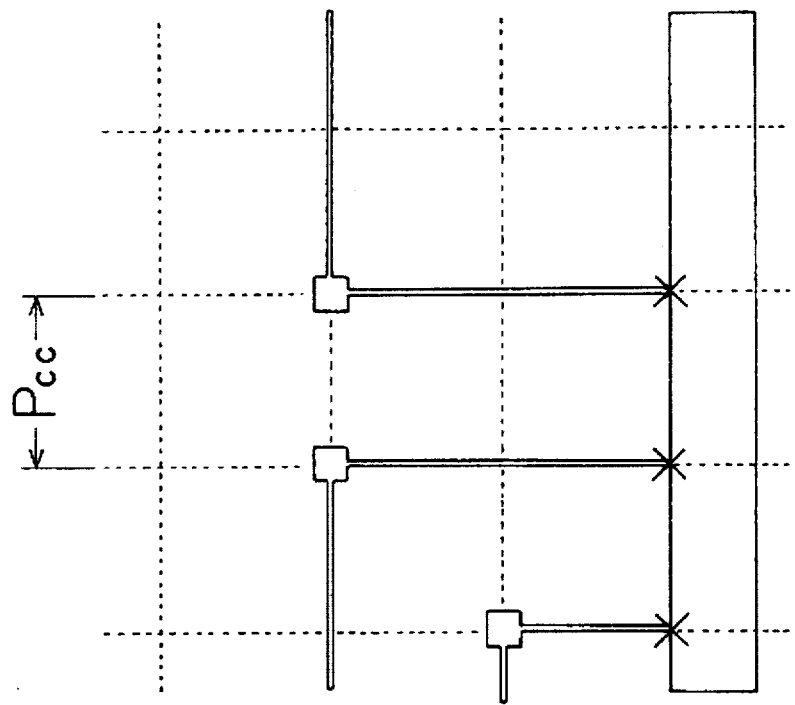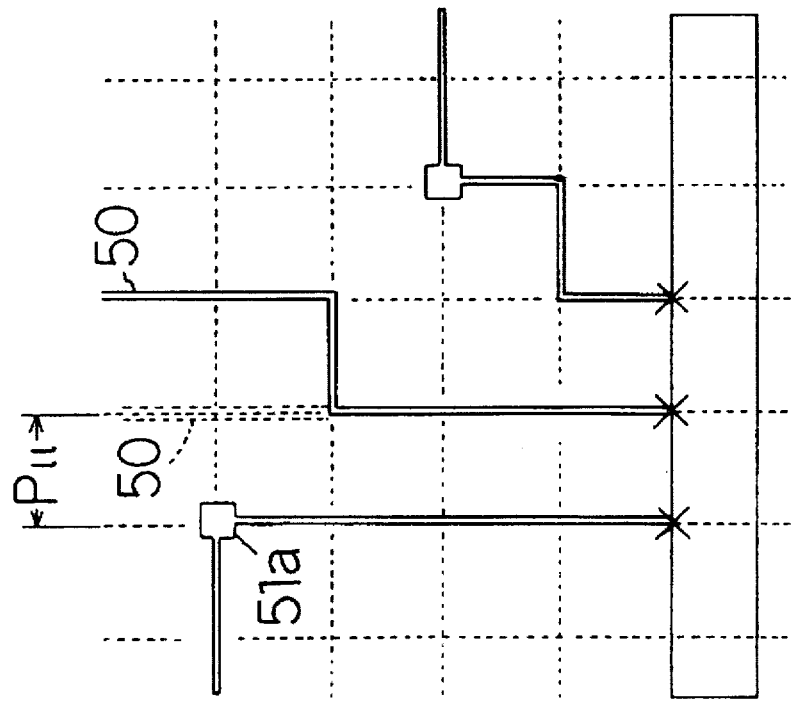

WIRING METHOD AND SYSTEM FOR INTEGRATED CIRCUIT

TECHNICAL FIELD OF THE INVENTION

The present invention relates to a wiring technique in printed circuit board (PCB) layout design as well as in large-scale integrated circuit (LSI) layout design.

The semiconductor industry has developed various automated wiring systems capable of automatically carrying out desired wiring in PCB or LSI layout design. The problem that confronts such design layout is how to realize the best layout and how to reduce the wiring area to a minimum.

The convention wiring methods may roughly be divided into a grid-aided wiring technique (hereinafter called the grid-routing technique) and a non grid-aided wiring technique (hereinafter called the non grid-routing technique). A grid-routing technique is disclosed by J. Soukup ("Fast Maze Router", Proc. 15th Design Automation Conference, pp. 100–102, 1978). As shown in FIG. 3a, in this grid-routing technique, grids 302 based on design criteria are defined in advance with respect to an area available for wiring. These grids 302 serve as a wiring route, and wiring patterns 303, interconnecting functional blocks 301, are generated according to the wiring route defined by the grids 302.

A non grid-routing technique is disclosed by W. Heyns et al ("A Line-Expansion Algorithm for the General Routing Problem with a Guaranteed Solution", Proc. 17th Design Automation Conference, pp. 243–249, 1980). Unlike the above-described grid-routing technique, this non grid-routing technique uses no grids 302. As shown in FIG. 3b patterns 304 interconnecting the functional blocks 301 are routed in such a way that given design criteria are met.

The grid-routing technique presents several advantages. For example, the occurrence of short circuiting between wires may be prevented as long as wiring patterns are arranged on grids based on design criteria. Therefore, semiconductor LSI wiring design by means of the grid-routing technique will not consume much time.

The non-grid-routing technique also presents several advantages. For example, wiring can be carried out taking into account design criterion limitations. This leads to a higher wiring density, thereby reducing the wiring area as small as possible. The size of the LSI can be made smaller.

Recently-developed very large scale integrated circuits (VLSI) contain millions of transistors, which deal with an enormous amount of data. The number of wirings (i.e., the number of nets) dramatically increases, as the number of internal buslines increases, for example, from 16 bits to 32 bits, and to 64 bits.

Both the grid-routing and non grid-routing techniques, however, have disadvantages. In the case of the grid-routing wiring technique, a large wiring area is required because given design criteria require large grids. For this reason, wiring area shortages takes place if such a grid-routing technique is applied to semiconductor VLSIs. Therefore, an unwanted situation that generation of some wiring patterns is unfinished may occur, and thus every wiring layout design is not completed.

In the case of the non-grid routing technique, it is very hard to determine the best wiring route because there is no position reference for wiring (that is, no guiding grids are provided.) and a wiring route search must be made over a large area. Further, as shown in FIG. 15 the processing time (i.e., the time required for carrying out wiring) increases as compared to the grid-routing technique, as the number of nets increases (see FIG. 15). Therefore, the non grid-routing technique is not suitable for VLSIs. Although the non grid-routing technique is capable of carrying out high-density wiring, it, like the grid-routing technique, may produce such an unwanted situation that every wiring layout design is not completed when carrying out very high-density wiring.

To cope with these problems, a technique known in the art as chip compaction is proposed to reduce the wiring area down to design criterion limitations. Suppose wiring routes are determined by means of a grid-routing technique which defines grids ignoring desired design criteria. In such a case, such chip compaction is used to compact a gap defined between two wiring patterns in order that the criteria are met, whereby wiring patterns are arranged at a high density. Although the chip compaction technique can reduce the size of semiconductor LSIs, it disadvantageously takes an extremely lengthy processing time if the amount of wiring data to be connected becomes too great.

As explained above, none of these techniques (i.e., the grid-routing technique, non grid-routing technique, and chip compaction technique) can manage to carry out semiconductor VLSI wiring in a short time in a considerably small wiring area.

SUMMARY OF THE INVENTION

Bearing in mind the aforesaid problems accompanied with the prior art techniques, the present invention was made. Therefore, it is a main object of the present invention to provide an improved wiring technique capable of carrying out every wiring within a smaller wiring area in a short time.

The invention provides a wiring method of establishing connections between aggregates having a given function according to connection information requirements. This wiring method comprises the following steps:

(a) a grid-routing step of defining a pattern of grids in such a manner that a part of predetermined design criteria are automatically met if wiring patterns being laid out take their route over the grids, and of generating wiring patterns of nets in such a manner that each of the design criteria is met; and (b) a non grid-routing step following the design criteria of generating, without taking into consideration the grids, wiring patterns of other nets which have not been connected at the grid-routing step, in such a manner that each of the design criteria is met.

The invention provides another wiring method of establishing connections between aggregates having a given function according to connection information requirements. This wiring method comprises the following steps:

(a) a grid-routing step of defining a pattern of grids in such a manner that a part of predetermined design criteria are automatically met if wiring patterns being generated take their route over the grids, and of generating wiring patterns of nets in such a manner that each of the design criteria is met;

(b) a non grid-routing step following the design criteria of generating, without taking into consideration the grids, wiring patterns of other nets which have not been connected at the grid-routing step, in such a manner that each of the design criteria is met;

(c) another non grid-routing step ignoring the design criteria of deciding wiring routes of still other nets which have not been connected at the non grid-routing step (b) ignoring the design criteria; and (d) a wiring area compaction step of shoving a part of the wiring patterns generated at the grid-routing step (a) and the non grid-routing step (b) in such a manner that each of the design criteria is met, and of generating wiring patterns with respect to the aforesaid wiring routes decided at the non grid-routing step (c) in such a manner that each of the design criteria is met.

The present invention provide a wiring apparatus for establishing connections between aggregates having a given function according to connection information requested. This wiring apparatus comprises the following elements:

(a) external input/output means at which the connection information and design criterion information are input;

(b) grid generation means for generating grids in such a manner that a part of predetermined design criteria are automatically met if wiring patterns being generated take their route on the grids;

(c) first storage means for storing information about the grids;

(d) grid-routing means for generating, on receiving the information about the grids, the connection information, and the design criterion information, wiring patterns of nets on the grids in such a manner that each of the design criteria is met;

(e) second storage means for storing the wiring patterns generated by the grid-routing means and wiring information about nets which have not been connected yet; and (f) non grid-routing mean following the design criteria for generating, on receiving the aforesaid wiring information and the design criterion information, wiring patterns of the unconnected nets in such a manner that each of the design criteria is met without taking into consideration the grids.

The present invention provides a modification of the above-described wiring apparatus. This modification further comprises the following elements:

(a) third storage means for storing the wiring patterns generated by the non grid-routing means following the design criteria and wiring information about nets which still have not been connected yet;

(b) another non grid-routing step ignoring the design criteria of deciding, on receiving the aforesaid wiring information and the design criteria, wiring routes of such unconnected nets, ignoring the design criteria;

(c) fourth storage means for storing the wiring routes decided by the non grid-routing means ignoring the design criteria; and (d) wiring area compaction means for shoving, on receiving information about the wiring patterns generated by the grid-routing means and the two non grid-routing means from the second, third, and fourth storages, a part of the wiring patterns generated by the grid-routing means and the non grid-routing means following the design criteria in such a manner that each of the design criteria is met, and of generating wiring patterns with respect to the aforesaid wiring routes decided by the non grid-routing means ignoring the design criteria in such a manner that each of the design criteria is met.

In accordance with the present invention, much of wiring of nets are carried out using the grid-routing technique and are completed in a short time. If the grid-routing technique is still used to carry out wiring to the remaining nets, the entire wiring layout design will not be completed due to wiring area shortage. In the present invention, however, the non grid-routing technique is used. As a result of employing such a technique, every wiring layout design comes to a completion in a short time even if a target wiring area is small.

In accordance with the present invention, if generation of a wiring pattern for a particular net cannot be done even by the non grid-routing technique, a wiring route of such a net is forcefully decided by the non grid-routing technique ignoring the design criteria. Thereafter, compaction is carried out so that every net wiring layout design is completed, with each of the design criteria met. Here, such compaction is locally carried out. As a result, every wiring can be finished in a short time.

BRIEF DESCRIPTION OF THE DRAWINGS

FIG. 2 is a block diagram of a wiring apparatus of the invention;

FIG. 11a shows a line-to-line-pitch wiring state and FIG. 11b shows a contact-to-contact-pitch wiring state;

DETAILED DESCRIPTION OF THE INVENTION

Figure 1:
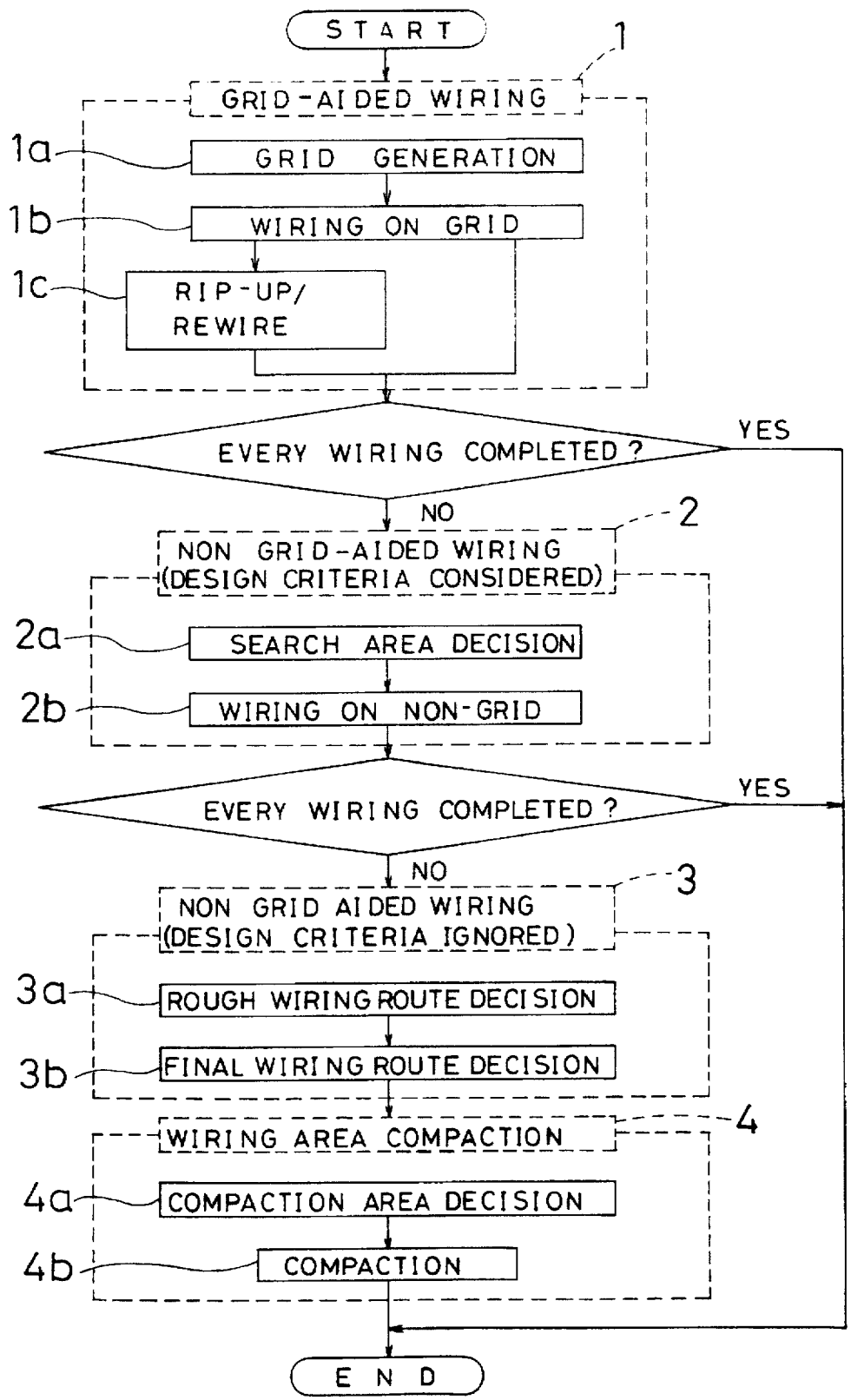
FIG. 1 is a flowchart showing wiring steps of the present invention.
Figure 3A:
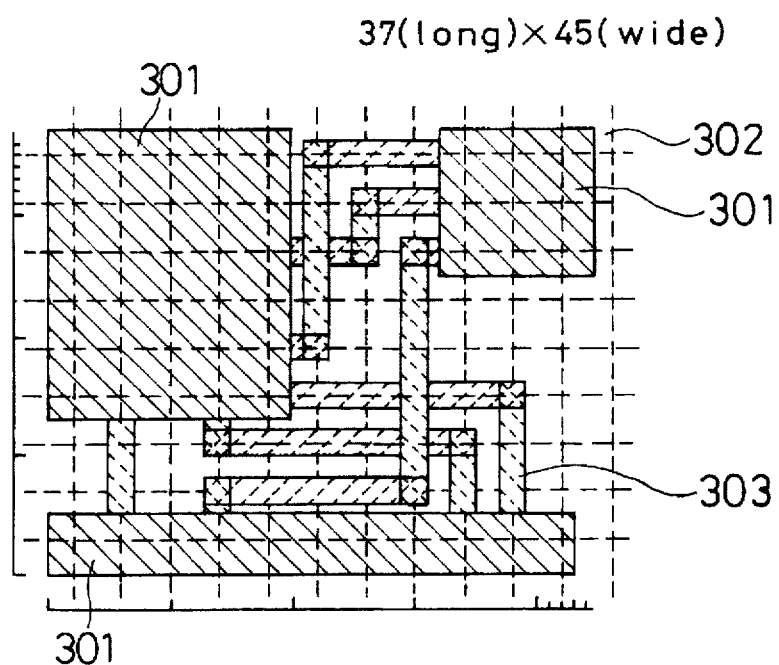
FIG. 3a shows a grid-routing technique and FIG. 3b shows a non grid-routing technique.
Figure 3B:
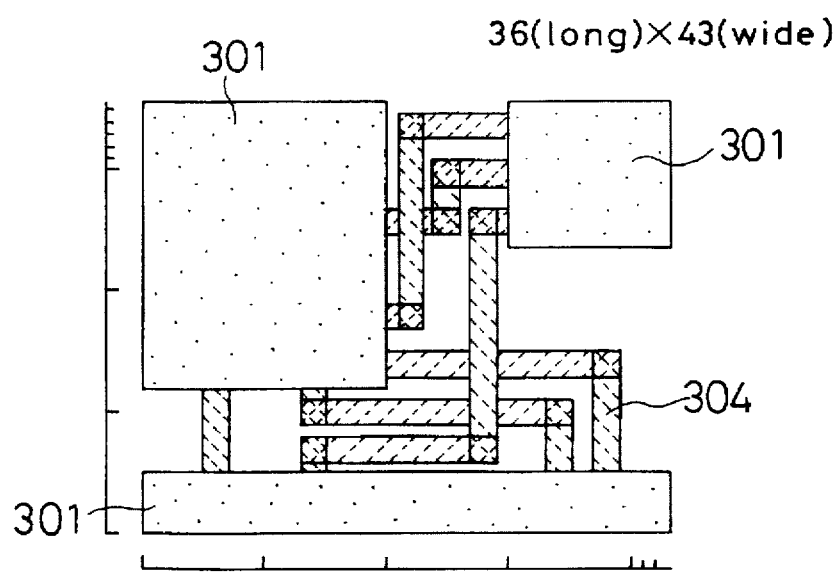

By making reference to the accompanying drawings, a preferred embodiment of the invention is now described below.

FIG. 2 schematically shows the entire organization of a wiring apparatus of the present embodiment. In the figure, an external input/output unit and an external display unit are indicated by reference numerals 5 and 6, respectively. The external I/O unit 5 receives design criterion information 13, connection information 14, and graphic information 15. The graphic information 15 is data about the position of plural aggregates having a given function, say, functional blocks. The connection information 14 is data indicative of the terminal-to-terminal connection relationship between one functional block and the other.

Figure 10A:
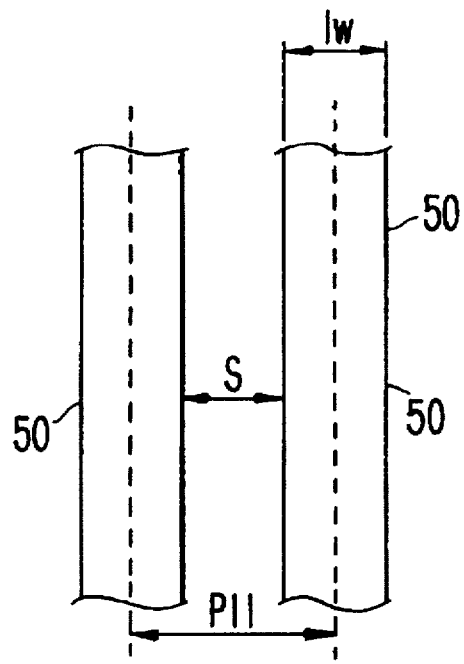
FIG. 10a is a diagram showing a case where grids are defined on a line-to-line-pitch basis.

A wiring pattern is formed by a line 50 and a square contact 51. The line 50 is formed by plural sublines which are connected together by the contact 51 in such a manner that one subline is perpendicular to the other. The design criterion information 13 carries information of a line width lw of the line 50, a width qw of the contact 51 (qw>lw), a line-to-line gap S of FIG. 10a, a line-to-contact gap S of FIG. 10b, and a contact-to-contact gap S of FIG. 10c. Here, the values of these gaps S are the same.

FIG. 2 shows a wiring controller 16 comprising the following elements: a grid generator 7; a grid-routing means 8; a non grid-routing means 9 following design criteria; a non grid-routing means 10 ignoring the design criteria; and a wiring area compaction means 11.

FIG. 2 further shows a storage means 12 comprising a first storage 17, a second storage 18, a third storage 19, and a fourth storage 20.

The process of wiring by the wiring controller 16 is explained by reference to FIG. 1.

Figure 4:
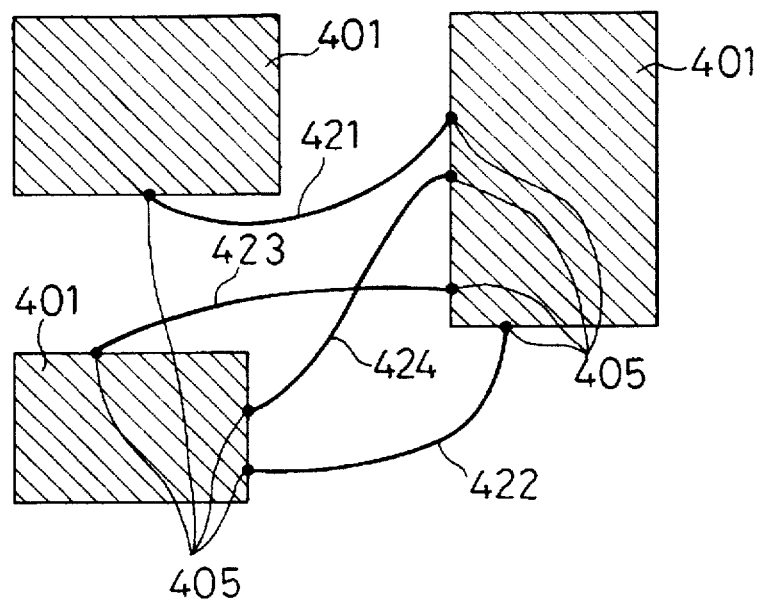
FIG. 4 shows plural nets interconnecting functional blocks.

FIG. 4 shows one wiring example in accordance with the present embodiment. In this example, wiring is carried out so as to generate wiring patterns to first to fourth nets 421 to 424 which are a collection of terminals to be connected between three functional blocks 401 at the same electric potential. In this example, an upper wiring layer and a lower wiring layer are used. One of the wiring layers is for horizontal wiring and the other is for vertical wiring. As shown in FIG. 4, each functional block 401 has a connection terminal 405.

At Step 1 which is a grid-routing step (see FIG. 1), the design criterion information 13 which must be satisfied at the time when carrying out wiring, the connection information 14, and the graphic information 15 are applied to the external I/O unit 5. Each information is immediately stored in the storage means 12.

Figure 5:
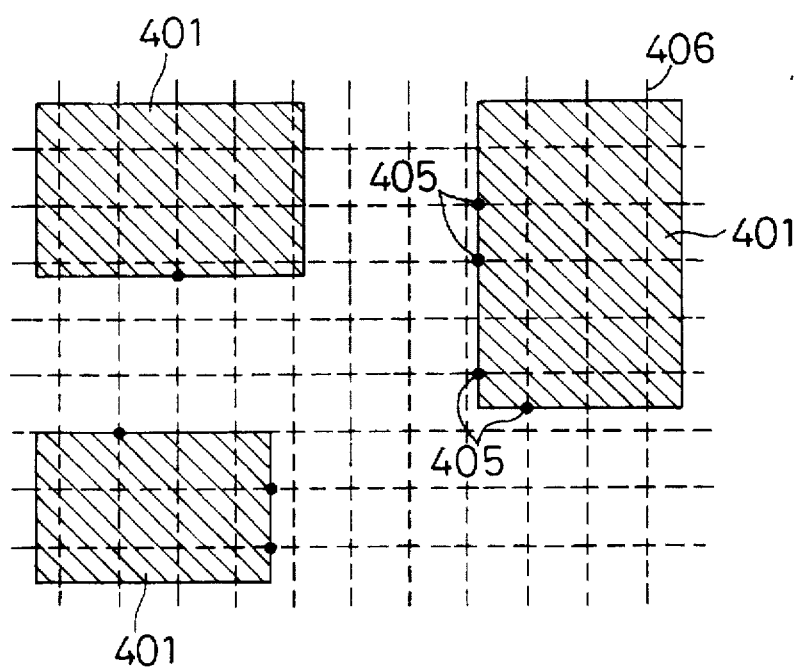
FIG. 5 shows a pattern of grids.

With reference to FIG. 5, Step 1 comprises Step 1a which is a grid generation step, Step 1b which is an on-grid routing step, and Step 1c which is a rip-up/re-wire step. At Step 1a, the design criterion information 13, the connection information 14, and the graphic information 15 of the storage means 12 are transferred to the grid generator 7. The size of grids 406 is defined by the grid generator 7 in such a manner that the design criterion information's 13 requirements met. Such grids thus defined are set on a drawing corresponding to the graphic information 15.

Figure 10B:
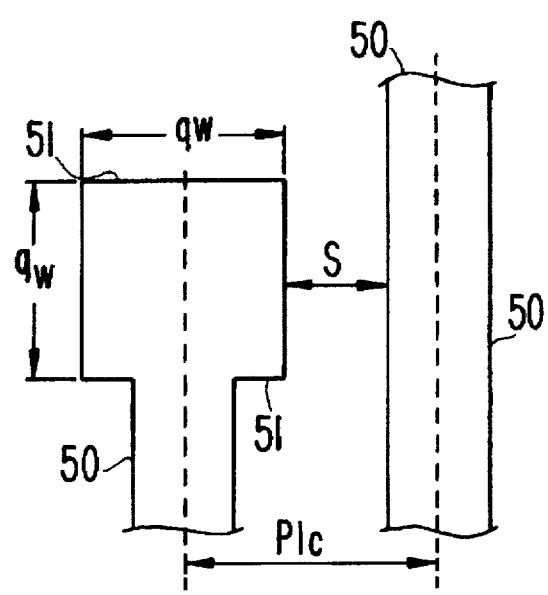
FIG. 10b is a diagram showing a case where grids are defined on a line-to-contact-pitch basis.
Figure 10C:
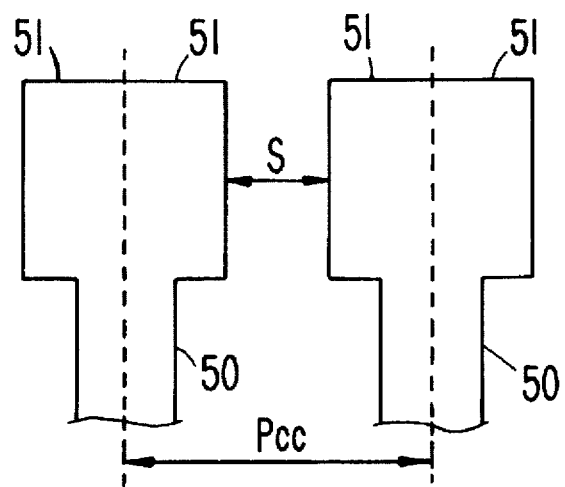
FIG. 10c is a diagram showing a case where grids are defined on a contact-to-contact-pitch basis.

Here, how the grid generator 7 defines grids is detailed. As shown in FIG. 10b, the grid pitch is set at a second grid pitch of $P_{lc}$ in order that the line-to-contact gap S is secured. Although $P_{ll} < P_{lc}$, the grid pitch is set at the second grid pitch $P_{lc}$. The reason for this is that a line 50 cannot be arranged next to another line 50 having thereon a contact 51a without getting bent, as shown in FIG. 11a. Therefore, the wiring density decreases. Further, the reason for not setting the grid pitch at a third grid pitch $P_{cc}$ is as follows. This third grid pitch $P_{cc}$ is greater than the second grid pitch $P_{lc}$, which means that the number of grids decreases. This produces a problem that the wiring density decreases.

If the individual connection terminals 405 of the functional blocks 401 are not on the grids defined above, wiring from each connection terminal 405 to its nearby grid should be made for re-definition of connection terminals.

Information about $P_{lc}$ is stored in the first storage 17.

Then, at Step 1b, the $P_{lc}$ information and the connection information 14 are transferred from the first storage 17 to the grid-routing means 8. The grid-routing means 8 generates net wiring patterns one after another according to the connection information 14, thereby establishing connection between the functional blocks 401.

Figure 6:
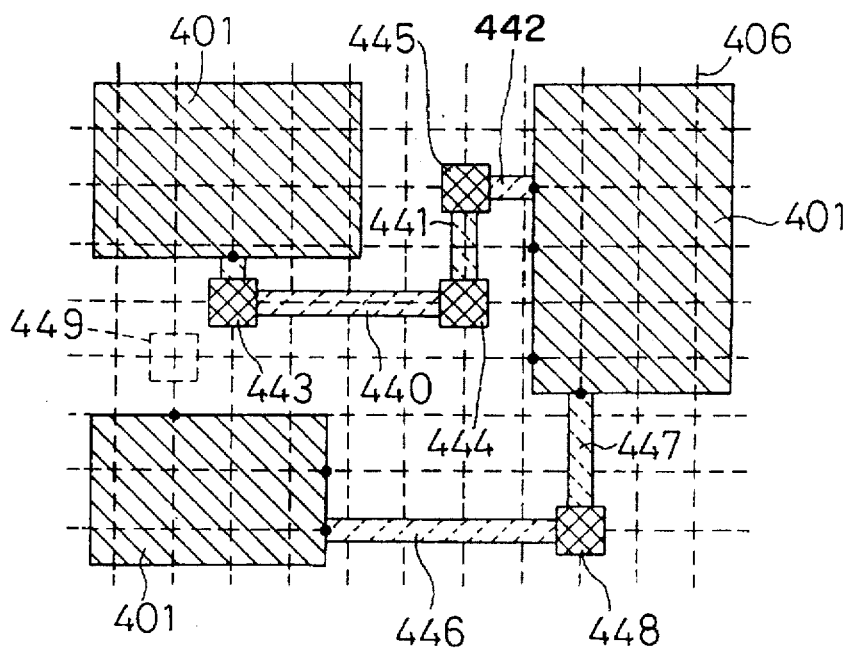
FIG. 6 shows a grid-routing step.

As shown in FIG. 6, three sublines 440–442 corresponding to the first net 421 and three contacts 443–445 bringing these three sublines 440–442 into contact with one another are generated. Two sublines 448 and 447 corresponding to the second net 422 and a contact 448 bringing these two lines 448–447 into contact with each other are arranged. Here, note that the third net 423 can receive no wiring patterns. The reason is as follows. If a contact 449 of the third net 423, indicated by broken line of FIG. 6, is centered, this causes short circuiting between the contact 443 of the first net 421 and the contact 449.

The wiring patterns generated by the grid-routing means 8 and wiring information about nets which have not been connected yet are stored in the second storage 18.

For convenience' sake, the number of nets is four in the present embodiment. However, if the number of nets is great, many nets will not be given their own wiring patterns and thus desired wiring layout design is not completed. In such a case, Step 1c must be carried out. At Step 1c, of all the wiring patterns generated at Step 1b a specific wiring pattern which will become an obstruction to a new wiring pattern being generated at a later step is cancelled. Then, such a new wiring pattern is generated and that obstructive wiring pattern is re-generated. Because of Step 1c, the wiring rate of wiring patterns at Step 1 increases. Therefore, the number of wiring patterns being generated at later steps decreases.

If every wiring layout design is completed at Step 1, the process itself comes to a completion. Here, wiring of the third and fourth nets 423 and 424 is unfinished. Accordingly, the process proceeds to Step 2 which is a non grid-routing step following the design criteria. At Step 2, the wiring information about nets which have not been connected and the design criterion information 13 are transferred from the second storage 18 to the non grid-routing means 9 following the design criteria. The non grid-routing means 9 generates wiring patterns, ignoring the grid 406 but following the design criterion information 13.

Step 2 comprises Step 2a which is a search area decision step and Step 2b which is a non on-grid routing step.

At Step 2a, a wiring route search area is specified for each unwired net. Such a wiring route search area is determined by the following evaluation function:

$HSL \times LSL = (X \times a) \times (Y \times b)$ where HSL and LSL are the horizontal and vertical side lengths of the wiring route search area, X and Y are the horizontal and vertical side lengths of a minimum rectangular zone surrounding a single unwired net, and "a" and "b" are arbitrary constants.

Figure 12:
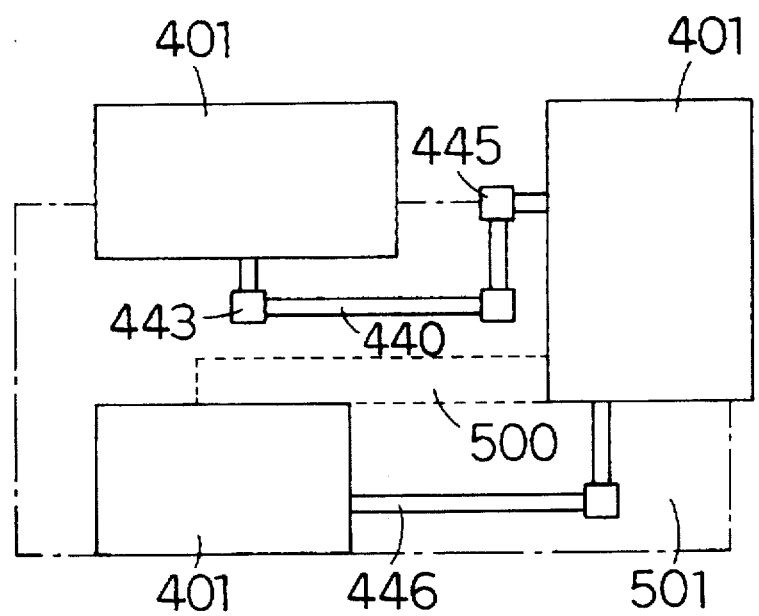
FIG. 12 shows a wiring route search area.

For the case of the third net 423, as shown in FIG. 12, "a" and "b" are set at values of 2 and 9 respectively for a minimum rectangular zone 500 surrounding the net 423 in question, and the wiring route search area is extended to a rectangular zone 501. Because of Step 2a, the need for searching remote areas is eliminated. Therefore, Step 2b requires less time for wiring.

Figure 7:
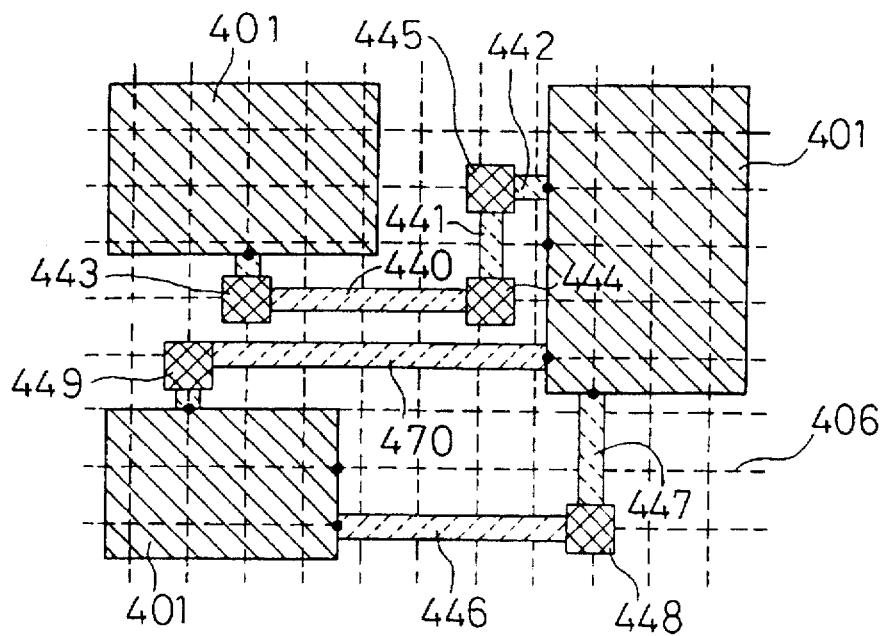
FIG. 7 shows a non grid-routing step following design criteria.

Next, as shown in FIG. 7, at Step 2b, a subline 470 of the third net 423 is arranged within the zone 500 from FIG. 12, and the contact 449 is off-centered in defiance of the grid 406 so as to secure the contact-to-contact gap S between the contact 443 and the contact 449.

At Step 2, the fourth net 424 cannot be connected. The reason is as follows. A contact of the fourth net 424 should be disposed in the vicinity of the contact 445 of the first net 421. However, since the contact 445 is centered and the sublines 440 and 441 are provided, the gap S cannot be secured no matter on which grid that contact of the fourth net 424 is arranged. Design criterion violations occur.

The wiring patterns generated by the non grid-routing means 9 and wiring information about nets which have not been connected are stored in the third storage 19.

If the non grid-routing means 9 finishes generating every wiring pattern, the wiring layout design is completed in accordance with the design criteria. However, wiring of the fourth net 424 has not been carried out, since the wiring, carried out earlier on the basis of the grid 406, is now occupying excess wiring areas. In order to carry out wiring to the fourth net 424, the process proceeds to Step 3 which is a non grid-routing step ignoring the design criteria.

At Step 3, wiring information about nets which have not been connected yet are stored in the third storage 19 is transferred to the non grid-routing means 10 ignoring the design criteria. Based on the received information, the non grid-routing means 10 carries out wiring ignoring the design criterion information 13. Step 3 comprises Step 3a which is a rough wiring route decision step and Step 3b which is a final wiring route decision step.

Step 3a is a step for deciding a rough wiring route, for an unwired net in such a way that a congested area is by-passed. First, a wiring area is divided into a plurality of channel sections. Of all possible candidate routes one particular route is selected by the following evaluation function.

rough route=min (the max channel congestion values of candidate routes)

Figure 13:
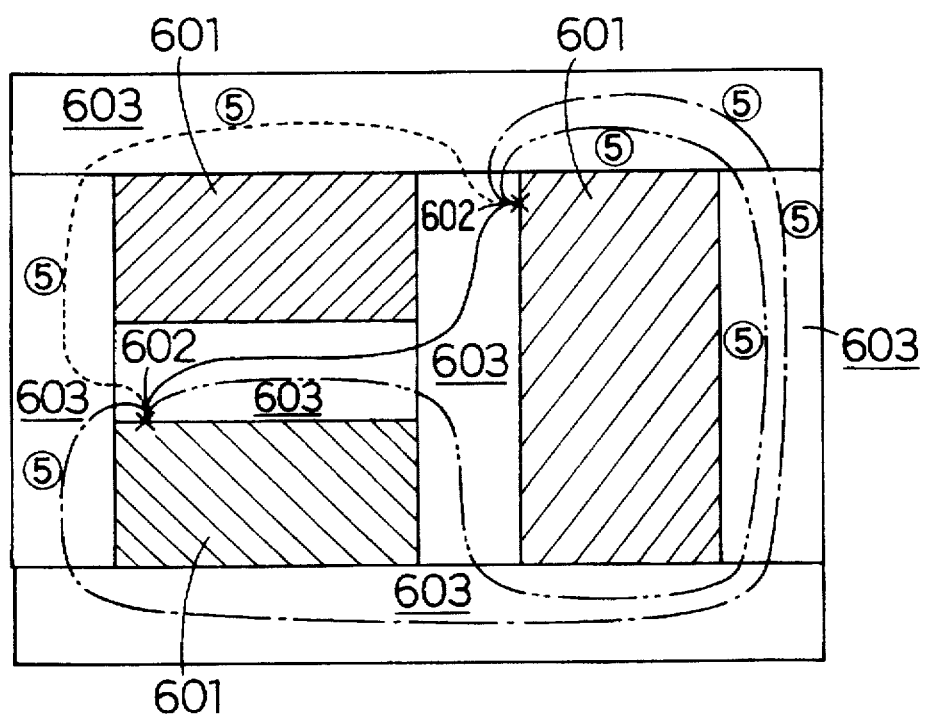
FIG. 13 shows how a rough wiring route is determined at a rough wiring route decision step of a non grid-routing step ignoring design criteria.

The above is explained with the help of FIG. 13. In the figure, three functional blocks 601 are shown. When interconnecting two terminals 602 of two of the three functional blocks 601, their peripheral wiring area is divided into six channels 603. In this example, candidate wiring routes are Routes 1 to 4. As shown in the figure, Route 1 involves two of the six channels 603 from starting point to destination, Route 2 three of them, Route 3 five of them, and Route 4 every channel. The maximum channel congestion values of Routes 1 to 4 are as follows:

Route 1=max (20, 15)=20
Route 2=max (5, 5, 5)=5
Route 3=max (5, 5, 5, 10, 5)=10
Route 4=max (5, 5, 5, 10, 15, 15)=15

Therefore, the rough route is obtained by:

rough route=min (20, 5, 10, 15)=Route 2

Figure 8:
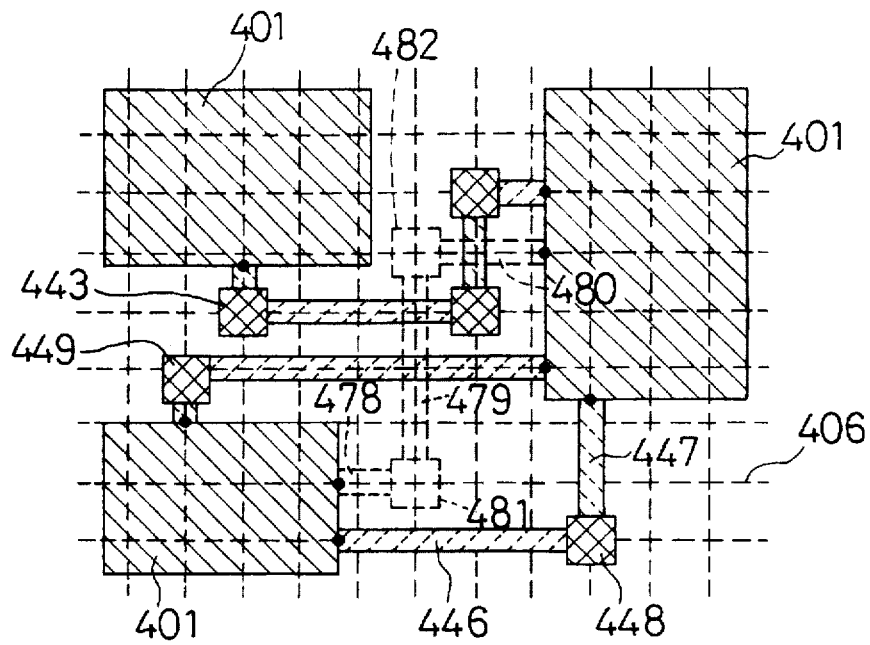
FIG. 8 shows a rough route decision step of a non grid-routing step ignoring design criteria for determining rough wiring routes.

Here, suppose a route, indicated by imaginary line of FIG. 8, is selected as a wiring route of the fourth net 424.

At Step 3b, the rough wiring route decided at Step 3a is decided in more detail. More specifically, sublines 478–480 and contacts 481 and 482 are arranged.

The wiring routes decided by the non grid-routing means 10 are stored in the fourth storage 20.

Wiring pattern generation of the fourth net 424 has not been completed in accordance with the design criterion information 13, so that the process proceeds to Step 4 which is a wiring area compaction step. At Step 4, the design criterion information 13 and wiring information which relates to wiring patterns which have already been wired so far are transferred from the fourth storage 20 to the wiring area compaction means 11 in order that wiring correction is made so as to satisfy the design criterior indicated by design criterion information 13.

Step 4 comprises Step 4a which is a compaction area decision step and Step 4b which is a compaction step.

At Step 4a, an wiring area subject to compaction is limited to an area out of the design criteria information's 13 requirements, or is limited to an area in the vicinity of a net whose wiring pattern is temporarily generated at Step 3. More specifically, the compaction area is specified in the same way that the search area is decided at Step 2a, using the following evaluation function.

$$HSL \times LSL = (X \times a) \times (Y \times b)$$

where HSL and LSL are the horizontal and vertical side lengths of a compaction area, X and Y are the horizontal and vertical side lengths of a minimum rectangular zone surrounding a net whose wiring pattern is temporarily generated, and a and b are arbitrary constants.

If local overlapping occurs between two or more compaction areas when limiting a compaction area per net whose wiring pattern is temporarily generated, a single compaction area may be defined by calculating the logical OR of these plural compaction areas. This reduces the number of compaction areas being compacted at a later step, namely Step 4b.

At Step 4b, the wiring area is compacted by moving all the wiring patterns wired at the non grid-routing step 3 within the compaction area specified per net so as to satisfy the design criterion information's 13 requirements. In other words, as shown in FIG. 9, in order to secure the contact-to-contact gap S, the contacts 443–445 of the net 421 are off-centered and the contacts 481 and 482, too, are off-centered.

Wiring pattern information corrected by the wiring area compaction means 11 is stored in the storage means 12.

Figure 9:
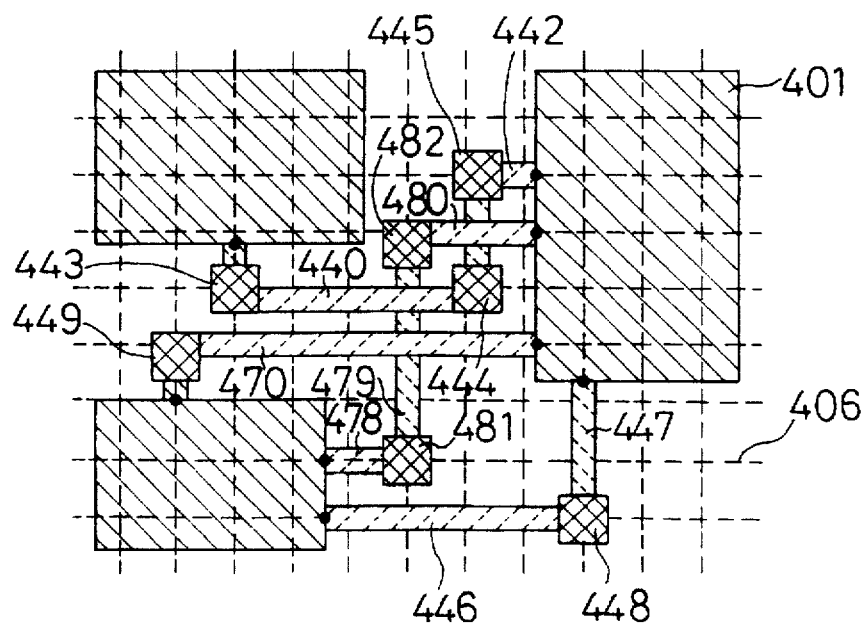
FIG. 9 shows a wiring area compaction step.

Every net wiring pattern generation is now completed satisfying the design criterion information's 13 requirements, as shown in FIG. 9. The process is completed.

Figure 14:
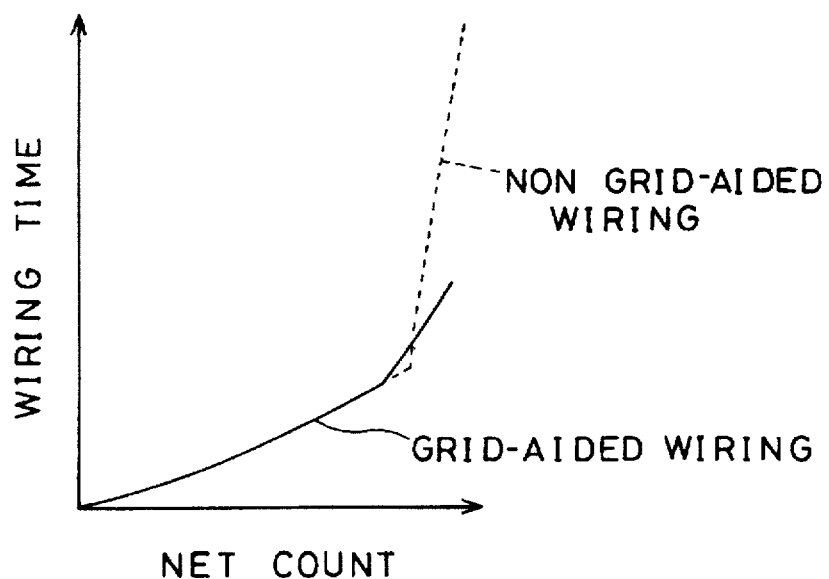
FIG. 14 is a graph showing the relationship of the wiring time versus the number of nets in the present invention.
Figure 15:
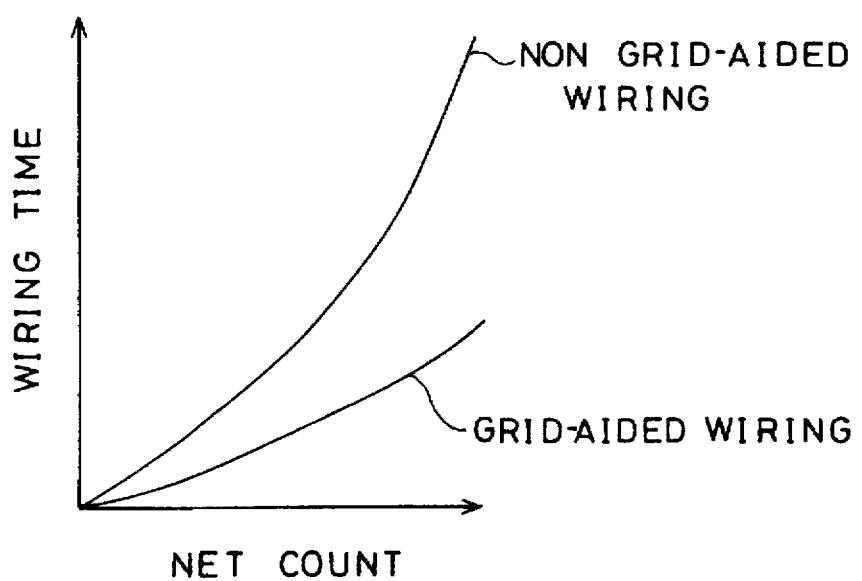
FIG. 15 is a graph showing the relationship of the wiring time versus the number of nets in a prior art technique.

In the present embodiment, almost all of the wiring patterns are wired at a grid-routing step and the remaining wiring is carried out at a non grid-routing step following the design criteria. Therefore, as shown in FIG. 14, it is possible to carry out the remaining wiring by a non grid-routing technique Just before a particular point from which the wiring time starts increasing substantially if only a grid-routing technique is used. Therefore, in accordance with the present embodiment, the wiring time can be shortened effectively.

In accordance with the present invention, where it is required to carry out more wiring in a smaller area, every required wiring pattern generation can be completed for a short time.

Further, information stored in the storage means 12 can be visually displayed on the screen of the external display unit 6. The external I/O device S is capable of controlling the processes of the means 6 to 11 and of receiving or delivering other data files, in addition to the previously mentioned functions.

In the present embodiment, wiring between three functional blocks has been described for convenience' sake, which, however, is not to be considered restrictive. For example, the present invention may be available for wiring between a functional block and a logical cell or between two logical cells.

Further, in the present embodiment, the number of wiring layers is two, but three or more layers may be used as wiring layers.

The invention claimed is:

1. A wiring method of establishing connections between aggregates having a given function according to connection information requirements, said wiring method comprising:

(a) a grid-routing step of defining grids in such a manner that a part of predetermined design criteria are automatically met if wiring patterns being generated take their route over said grids, and of generating wiring patterns of nets in such a manner that each of said design criteria is met;

(b) a non grid-routing step following said design criteria of generating, without taking into consideration said grids, wiring patterns of other nets which have not been connected at said grid-routing step, in such a manner that each of said design criteria is met;

(c) another non grid-routing step ignoring said design criteria of deciding wiring routes of still other nets which have not been connected at said non grid-routing step (b), in such a manner that said design criteria is not met; and (d) a wiring area compaction step of shoving a part of the wiring patterns generated at said grid-routing step (a) and said non grid-routing step (b) in such a manner that each of said design criteria is met, and of generating wiring patterns with respect to the aforesaid wiring routes decided at said non grid-routing step (c) in such a manner that each of said design criteria is met.

2. The method of claim 1, wherein connections are established between functional blocks, between a functional block and a logical cell, or between logical cells.

3. The method of claim 1, wherein the wiring patterns are formed by lines having a given line width and contacts having a given length and width, and a part of said design criteria are met if a gap between a line and its opposite contact is greater than a set distance.

4. The method of claim 1, wherein the wiring patterns are formed by lines having a given line width and contacts having a given length and width, and each of said design criteria is met if a gap between two lines is greater than a first set distance, if a gap between a line and its opposite contact is greater than a second set distance which is greater than said first set distance, and if a gap between a contact and its opposite contact is greater than a third set distance which is greater than said second set distance.

5. The method of claim 1, wherein said grid-routing step further includes a step of ripping-up a previously generated wiring pattern which is an obstruction to a new wiring pattern being generated, of generating such a new wiring pattern, and of re-generating the ripped-up wiring pattern.

6. The method of claim 1, wherein said non grid-routing step following said design criteria further includes a step of limiting a wiring route search area of a net to which a wiring pattern has not been generated.

7. The method of claim 1, wherein said non grid-routing step ignoring said design criteria further includes a step of deciding a rough wiring route of a net which cannot be connected at said non grid-routing step or by said non grid-routing means following said design criteria in such a way that such a decided rough wiring route by-passes a congested area.

8. The method of claim 1, wherein said wiring area compaction step further includes a step of limiting an area where a wiring pattern is shifted or generated to a particular area in the vicinity of the wiring route decided at said non grid-routing step.

9. A wiring apparatus for establishing connections between aggregates having a given function according to connection information requested, said wiring apparatus comprising:

(a) external input/output means at which said connection information and design criterion information are input;

(b) grid generation means for generating grids in such a manner that a part of predetermined design criteria are automatically met if wiring patterns being generated take their route on said grids;

(c) first storage means for storing information about said grids;

(d) grid-routing means for generating, on receiving the information about said grids, said connection information, and said design criterion information, wiring patterns of nets on said grids in such a manner that each of said design criteria is met;

(e) second storage means for storing the wiring patterns generated by said grid-routing means and wiring information about nets which have not been connected yet;

(f) non grid-routing means following said design criteria for generating, on receiving the aforesaid wiring information and said design criterion information, wiring patterns of the unconnected nets in such a manner that each of said design criteria is met without taking into consideration said grids.

(g) third storage means for storing the wiring patterns generated by said non grid-routing means following said design criteria, and wiring information about nets which still have not been connected yet;

(h) another non grid-routing means for ignoring said design criteria of deciding, on receiving the aforesaid wiring information and said design criteria, wiring routes of such unconnected nets, in defiance of said design criteria;

(i) fourth storage means for storing said wiring routes decided by said non grid-routing means ignoring said design criteria; and (j) wiring area compaction means for shoving, on receiving information about the wiring patterns generated by said grid-routing means and the two non grid-routing means from said second, third, and fourth storage means, a part of the wiring patterns generated by said grid-routing means and said non grid-routing means following said design criteria in such a manner that each of said design criteria is met, and of generating wiring patterns with respect to the aforesaid wiring routes decided by said non grid-routing means ignoring said design criteria in such a manner that each of said design criteria is met.

10. The apparatus of claim 9, further including, an external display unit capable of displaying results or results at a certain point produced by at least one of said external input/output means, said grid generation means, said grid-routing means, said non grid-routing means following said design criteria, said non grid-routing means ignoring said design criteria, and said wiring area compaction means.

11. The apparatus claim 9, wherein connections are established between functional blocks, between a functional block and a logical cell, or between logical cells.

12. The apparatus claim 9, wherein the wiring patterns are formed by lines having a given line width and contacts having a given length and width, and a part of said design criteria are met if a gap between a line and its opposite contact is greater than a set distance.

13. The apparatus claim 9, wherein the wiring patterns are formed by lines having a given line width and contacts having a given length and width, and each of said design criteria is met if a gap between two lines is greater than a first set distance, if a gap between a line and its opposite contact is greater than a second set distance which is greater than said first set distance, and if a gap between a contact and its opposite contact is greater than a third set distance which is greater than said second set distance.

14. The apparatus claim 9, wherein said grid-routing means further includes a means of ripping-up a previously generated wiring pattern which is an obstruction to a new wiring pattern being generated, of generating such a new wiring pattern, and of re-generating the ripped-up wiring pattern.

15. The apparatus claim 9, wherein said non grid-routing means following said design criteria further includes a means of limiting a wiring route search area of a net to which a wiring pattern has not been generated.

16. The apparatus claim 9, wherein said non grid-routing means ignoring said design criteria further includes a means of deciding a rough wiring route of a net which cannot be connected by said non grid-routing means following said design criteria in such a way that such a decided rough wiring route by-passes a congested area.

17. The apparatus claim 9, wherein said wiring area compaction means further includes a means of limiting an area where a wiring pattern is shifted or generated to a particular area in the vicinity of the wiring route decided by said non grid-routing means ignoring said design criteria.

* * * * *